(12) United States Patent  
Allen et al.

(10) Patent No.: US 8,039,331 B2
(45) Date of Patent: Oct. 18, 2011

(54) OPTO-THERMAL ANNEALING METHODS FOR FORMING METAL GATE AND FULLY SILICIDED GATE-FIELD EFFECT TRANSISTORS

(75) Inventors: Scott D. Allen, Ledgewood, NJ (US); Cyril Cabral, Jr., Mahopac, NY (US); Kevin K. Dezfulian, Mount Kisco, NY (US); Sunfei Fang, Langrangeville, NY (US); Brian J. Greene, Yorktown Heights, NY (US); Rajarao Jammy, Hopewell Junction, NY (US); Christian Lavoie, Ossining, NY (US); Zhijiong Luo, Carmel, NY (US); Hung Ng, New Milford, NJ (US); Chun-Yung Sung, Poughkeepsie, NY (US); Clement H. Wann, Carmel, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 621 days.

(21) Appl. No.: 12/120,286

(22) Filed: May 14, 2008

(65) Prior Publication Data

US 2008/0220581 A1 Sep. 11, 2008

Related U.S. Application Data

(63) Continuation of application No. 11/408,522, filed on Apr. 21, 2006, now Pat. No. 7,410,852.

(51) Int. Cl.
*H01L 21/336* (2006.01)
*H01L 21/8234* (2006.01)

(52) U.S. Cl. .............. 438/197; 438/199; 257/E21.632

(58) Field of Classification Search .............. 438/197, 438/199, 301, 535; 257/E21.632
See application file for complete search history.

(56) References Cited

U.S. PATENT DOCUMENTS

| | | | |
|---|---|---|---|
| 6,043,545 A | 3/2000 | Tseng et al. | |
| 6,150,243 A | 11/2000 | Wieczorek et al. | |
| 6,475,888 B1 | 11/2002 | Sohn | |
| 6,940,087 B2 | 9/2005 | Komoda et al. | |
| 7,074,655 B2 * | 7/2006 | Lochtefeld et al. | 438/149 |
| 2002/0098689 A1 | 7/2002 | Chong et al. | |
| 2007/0202640 A1 | 8/2007 | Al-Bayati et al. | |
| 2007/0249131 A1 | 10/2007 | Allen et al. | |

* cited by examiner

*Primary Examiner* — Hoai V Pham
(74) *Attorney, Agent, or Firm* — Scully, Scott, Murphy & Presser, P.C.; Louis J. Percello, Esq.

(57) ABSTRACT

An opto-thermal annealing method for forming a field effect transistor uses a reflective metal gate so that electrical properties of the metal gate and also interface between the metal gate and a gate dielectric are not compromised when opto-thermal annealing a source/drain region adjacent the metal gate. Another opto-thermal annealing method may be used for simultaneously opto-thermally annealing: (1) a silicon layer and a silicide forming metal layer to form a fully silicided gate; and (2) a source/drain region to form an annealed source/drain region. An additional opto-thermal annealing method may use a thermal insulator layer in conjunction with a thermal absorber layer to selectively opto-thermally anneal a silicon layer and a silicide forming metal layer to form a fully silicide gate.

8 Claims, 4 Drawing Sheets

OPTO-THERMAL ANNEALING METHODS FOR FORMING METAL GATE AND FULLY SILICIDED GATE-FIELD EFFECT TRANSISTORS

RELATED APPLICATIONS

This application is a continuation application U.S. Ser. No. 11/408,522, filed Apr. 31, 2006.

BACKGROUND

1. Field of the Invention

The invention relates generally to semiconductor device fabrication and in particular to the fabrication of field effect transistor (FET) devices. More particularly, the invention relates to opto-thermal annealing methods for fabricating field effect transistor devices.

2. Description of the Related Art

A field effect transistor comprises a gate electrode that conventionally comprises a polysilicon or polycide material. The gate electrode is located upon a gate dielectric. The gate dielectric is located upon a semiconductor substrate. A pair of source/drain regions is located within the semiconductor substrate and separated by a channel region located beneath and aligned with the gate electrode. The basic field effect transistor device structure, as described above, has been successfully scaled to increasingly smaller dimensions for over forty years.

Field effect transistor device performance may be improved by reducing the effective thickness of the gate dielectric. However, continued scaling of field effect transistor devices presents difficulties insofar as further reduction of the physical gate dielectric thickness leads to excessive gate leakage.

Within the context of current gate dielectric thicknesses, it is also desirable to minimize the polysilicon gate depletion effect. Such a depletion effect arises when a polysilicon gate is electrically activated and a region depleted of charge is formed at an interface between the polysilicon gate and the gate dielectric. The existence of such a depletion region reduces capacitance of the gate dielectric and thus increases the effective gate dielectric thickness. As a result of the increased effective gate dielectric thickness, field effect transistor device performance is compromised.

In an effort to eliminate the polysilicon depletion effect, metal gate field effect transistors and fully silicided gate field effect transistors have become of interest. Metal gate field effect transistors and fully silicided gate field effect transistors are readily fabricated by simple substitution of a metal gate or a fully silicide gate for a polysilicon gate. However, a major impediment for implementation of metal gate field effect transistors is thermal stability of a metal gate electrode and an interface between the metal gate and the gate dielectric.

In a conventional field effect transistor manufacturing process, a high temperature of about 1000° C. or greater is needed to activate extension region and contact region portions of source/drain region dopants. During this high temperature dopant activation anneal in the conventional field effect transistor fabrication process, the work function of a metal gate, or threshold voltage (Vt) of the field effect transistor, may shift significantly due to interdiffusion and interface reactions between the metal gate and the gate dielectric. Fully silicided gate field effect transistors may, under certain circumstances, also have thermal exposure limitations.

Since field effect transistor devices are certain to be prevalent within microelectronics fabrication, and since performance of field effect transistors is certainly enhanced with metal gates or fully silicided gates, use of field effect transistors with metal gates and fully silicided gates is certain to continue.

SUMMARY OF THE INVENTION

The invention provides opto-thermal annealing methods for fabricating metal gate field effect transistors and fully silicided gate field effect transistors. The methods of the present invention are applicable to metal gate field effect transistors where a reflectivity is selected to avoid opto-thermal induced degradation of metal gate properties. The inventive methods also provide for opto-thermal annealing to form a fully silicided gate, with or without simultaneously opt-thermal annealing a source/drain region to form an annealed source/drain region.

One method for forming a metal gate field effect transistor in accordance with the invention includes forming a metal gate upon a gate dielectric formed over a semiconductor substrate, and using at least the metal gate as a mask to form a source/drain region into the semiconductor substrate. In accordance with this method, the metal gate is selected to have an opto-thermal annealing radiation reflectivity to avoid opto-thermal annealing damage to the metal gate and metal gate to gate dielectric interface when opto-thermal annealing the source/drain region. This particular method also includes opto-thermal annealing the source/drain region to form an annealed source/drain region while avoiding opto-thermal annealing damage to the metal gate and metal gate to gate dielectric interface.

Another method in accordance with the invention includes forming a stack layer comprising a silicide forming metal layer contacting a silicon layer over a semiconductor substrate. This method also includes forming a source/drain region into the semiconductor substrate while using at least the stack layer as a mask. Finally, this method also includes simultaneously opto-thermally annealing the stack layer to form a fully silicide gate electrode and the source/drain region to form an annealed source/drain region.

Finally, an additional method in accordance with the invention includes forming a stack layer comprising a silicide forming metal contacting a silicon layer over a semiconductor substrate. This additional method also includes forming a source/drain region into the semiconductor substrate while using at least the stack layer as a mask. This additional method also includes forming a thermal insulator layer upon the source/drain region. This additional method also includes forming a thermal absorber layer upon the stack layer. Finally, this additional method also includes selectively opto-thermally annealing the stack layer to form a fully silicided gate electrode while not annealing the source/drain region.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, that form a material part of this disclosure, wherein.

DESCRIPTION OF THE PREFERRED EMBODIMENTS

The invention, which provides laser annealing methods for forming metal gate field effect transistors and fully silicided gate field effect transistors, is described in further detail below. The drawings, which are provided for illustrative purposes and are not necessarily drawn to scale, are described in further detail above.

Figure 1:
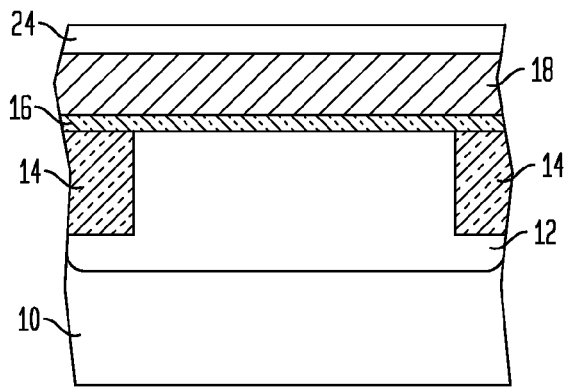
FIG. 1 to FIG. 6 show a series of schematic cross-sectional diagrams illustrating the results of progressive stages in fabricating a metal gate field effect transistor in accordance with an embodiment of the invention.

FIG. 1 to FIG. 6 show a series of schematic cross-sectional diagrams illustrating the results of progressive stages in fabricating a metal gate field effect transistor in accordance with an embodiment of the invention. FIG. 1 shows a schematic cross-sectional diagram of the metal gate field effect transistor at an early stage in its fabrication in accordance with the embodiment of the invention.

FIG. 1 shows a semiconductor substrate 10. A pair of isolation regions 14 is separated by an active region of the semiconductor substrate 10. The active region includes a doped well 12. A gate dielectric material layer 16 is located upon the isolation regions 14 and the doped well 12. A metal gate material layer 18 is located upon the gate dielectric material layer 18. A capping material layer 24 is located upon the metal gate material layer 18.

Each of the foregoing semiconductor substrate 10, structures and layers may comprise materials, have dimensions and be formed using methods that are conventional in the semiconductor fabrication art. For example, the semiconductor substrate 10 may comprise a semiconductor material selected from the group including but not limited to silicon, germanium, silicon-germanium alloy, silicon carbide, silicon-germanium carbide and compound semiconductor materials. Non-limiting examples of compound semiconductor materials include indium phosphide, gallium arsenide and indium arsenide compound semiconductor materials.

The semiconductor substrate 10 may comprise a bulk semiconductor substrate. Alternatively, the semiconductor substrate 10 may comprise a semiconductor-on-insulator substrate. The semiconductor-on-insulator substrate comprises a base semiconductor substrate, a buried dielectric layer located thereupon and a surface semiconductor layer located further thereupon. Semiconductor-on-insulator substrates may be fabricated using various layering methods, including layer transfer methods, as well as lamination methods and separation by implantation of oxygen (SIMOX) methods.

Alternatively, the semiconductor substrate 10 may also comprise a hybrid orientation (HOT) substrate that has multiple regions of different crystallographic orientations.

Typically, the doped well 12 of the semiconductor substrate 10 is doped to a level from about 1e16 to about 1e18 dopant atoms per cubic centimeter, and the base portion of the semiconductor substrate 10 is doped to a level from about 1e14 to about 1e16 dopant atoms per cubic centimeter.

The isolation regions 14 may comprise isolation materials selected from the group including but not limited to oxides, nitrides and oxynitrides of silicon. Oxides, nitrides and oxynitrides of other elements are not excluded. The isolation materials may be formed using methods including but not limited to thermal or plasma oxidation or nitridation methods, chemical vapor deposition methods (including atomic layer chemical vapor deposition methods) and physical vapor deposition methods (including evaporation methods). Typically, the isolation regions 14 comprise a silicon oxide material. Trench isolation regions and/or field oxide isolation regions are contemplated as isolation regions 14.

The gate dielectric material layer 16 may comprise a generally lower dielectric constant gate dielectric material such as an oxide, nitride or oxynitride of silicon having a dielectric constant from about 4 to about 20. Alternatively, the gate dielectric material layer 16 may comprise a gate dielectric material having a generally higher dielectric constant in a range from about 20 to about 100. Such alternative gate dielectric materials may include, but are not limited to titanium oxides, hafnium oxides, hafnium silicates, barium-strontium titanates (BSTs), and lead-zirconate titanates (PZTs), including the addition of nitrogen to such materials. The alternative gate dielectric materials may also include composites and layered films with multiple dielectric materials for which the dielectric constant may range from 4 to about 100. The gate dielectric material layer 16 may be formed using any of several methods appropriate to its materials of composition. Non-limiting examples include thermal or plasma oxidation or nitridation methods, chemical vapor deposition methods (including atomic layer chemical vapor deposition methods) and physical vapor deposition methods (including sputtering methods). Typically, the gate dielectric material layer 16 comprises a thermal silicon oxide material having a thickness from about 20 to about 70 angstroms.

The metal gate material layer 18 may comprise any of several metal gate materials. Non-limiting examples include certain metals and metal alloys of aluminum, tungsten, titanium, tantalum, molybdenum, magnesium, platinum, rhenium, rhodium, iridium, and their binary or ternary conductive metallic compounds thereof such as WN, TiN, TaN, MoN, $MoO_2$, TaSiN, (which are also intended to include non-stoichiometric derivatives). The metals may be deposited using methods including, but not limited to: plating methods, chemical vapor deposition methods and physical vapor deposition methods. Typically, the metal gate material layer 18 has a thickness from about 150 to about 2000 angstroms.

The capping material layer 24 may comprise any of several capping materials. Included are oxides, nitrides and oxynitrides of silicon. Oxides, nitrides and oxynitrides of other elements are not excluded. The capping material layer 24 may be deposited using any of several methods. Non-limiting examples include chemical vapor deposition methods (including atomic layer chemical vapor deposition methods) and physical vapor deposition methods (including sputtering methods).

Figure 2:
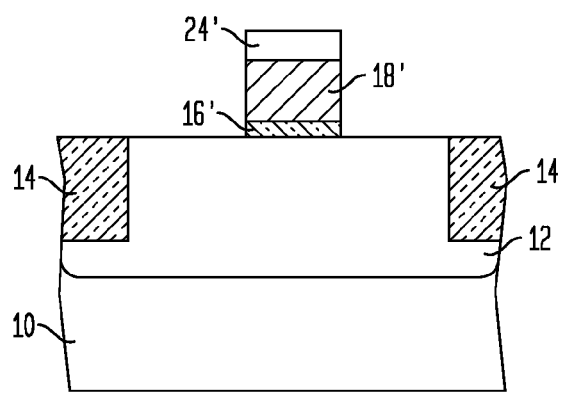

FIG. 2 shows the results of sequentially patterning the capping material layer 24, the metal gate material layer 18 and the gate dielectric material layer 16 to form a gate electrode stack that comprises a gate dielectric 16', a metal gate 18' located thereupon and a capping layer 24' located further thereupon. The sequential patterning is typically undertaken using an anisotropic plasma etch method, that provides that the sidewalls of the capping layer 24', the metal gate electrode 18, and the gate dielectric 16' are vertical or nearly so.

The anisotropic plasma etch method typically uses a fluorine containing etchant gas composition for etching a silicon containing dielectric material. The anisotropic plasma etch method may also use a fluorine containing etchant gas composition or a chlorine containing etchant gas composition, as appropriate for etching the metal gate material layer 18 when forming the metal gate 18'.

Figure 3:
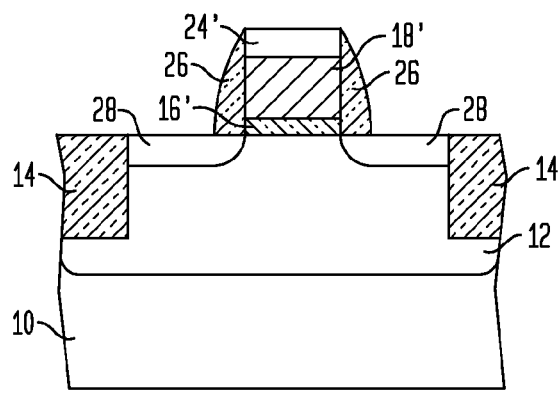

FIG. 3 shows a spacer 26 (i.e., two spacers in cross-sectional view, but a single spacer in plan-view) adjoining a pair of opposite sides of the gate dielectric 16', the metal gate 18' and the capping layer 24'. The spacer 26 may comprise any of several spacer materials. Oxides, nitrides and oxynitrides of silicon are common spacer materials. Oxides, nitrides and oxynitrides of other elements are not excluded. Non-limiting examples of methods for forming the spacer 26 include chemical vapor deposition methods and physical vapor deposition methods. Typically the spacer 26 comprises a silicon oxide, a silicon nitride, a silicon oxynitride or a composite thereof.

FIG. 3 also shows a pair of source/drain regions 28 located within the active region of the semiconductor substrate 10. The pair of source/drain regions 28 is separated by a channel region located beneath the metal gate 18'. The pair of source/drain regions 28 is formed using a two step ion implantation method. A first step within the two step ion implantation method uses the metal gate 18' as a mask to form a pair of extension regions within the semiconductor substrate 10. A second step within the two step ion implantation method uses the metal gate 18' and the spacer 26 as a mask to form a larger contact region portion of the source/drain regions 28. Source/drain regions 28 thus comprise extension regions and contact regions.

Figure 4:
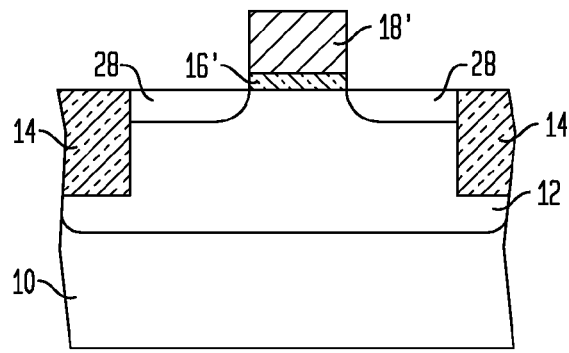

FIG. 4 shows the results of stripping the spacer 26 and the capping layer 24' to leave remaining the gate dielectric 16' and the metal gate 18'. The spacer 26 and the capping layer 24' may be stripped using methods and materials that are conventional in the semiconductor fabrication art. Non-limiting examples of methods include wet chemical methods and dry plasma methods.

Figure 5:
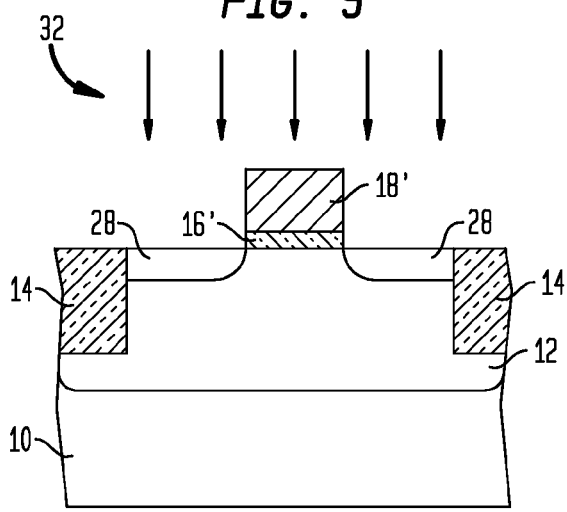

FIG. 5 shows the results of opto-thermally annealing the semiconductor structure of FIG. 4, while using an opto-thermal annealing treatment 32. The opto-thermal annealing treatment 32 may comprise a flash annealing treatment, a laser annealing treatment or any other optically based annealing treatment that provides a temperature and timescale in accord with disclosure below. Flash annealing treatments typically use white or multi-wavelength light in a range from about 200 to about 800 nm. Laser annealing treatments are generally monochromatic and typically undertaken using an 880 nm laser wavelength. Other laser wavelengths may also be used, and they may range from 200 nm to 1200 nm. The opto-thermal annealing is also undertaken using a temperature from about 1000° to about 1400° centigrade for a time period from about 0.01 milliseconds (i.e., 10 nanoseconds) to about 100 milliseconds.

When undertaking the opto-thermal annealing that is illustrated in FIG. 5, the metal gate 18' is selected to have a reflectivity so that when opto-thermal annealing the source/drain regions 28, electrical properties of the metal gate 18' (and also interface between metal gate 18' and gate dielectric 16') are not compromised. Typical electrical properties that are subject to compromise include a work function and an electrical conductivity. Within the context of a metal gate such as Ti (titanium), such conditions are met when the Ti metal gate has a reflectivity of at least about 50 percent. Other metals will have different reflectivity requirements that provide for absence of compromise of electrical properties of a metal gate when laser annealing an adjoining source/drain region. The reflectivity requirements may be determined by a person skilled in the art by measurement of an electrical property of interest as a function of a particular metal gate material and a reflectivity of a metal gate fabricated from the material.

Figure 6:
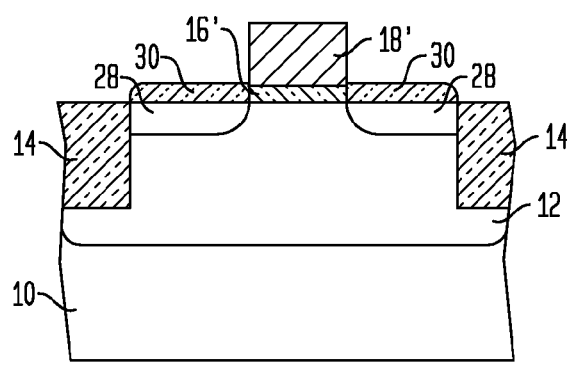

FIG. 6 shows a pair of silicide layers 30 located upon the pair of annealed source/drain regions 28'. The pair of silicide layers 30 may comprise any of several silicide materials. Platinum, cobalt, nickel, tungsten, vanadium, titanium, and their alloys are common silicide materials. Other silicide materials are not excluded. The pair of silicide layers 30 is typically formed using a salicide (i.e., self-aligned silicide) method, although other methods may also be used. Typically, each of the silicide layers 30 has a thickness from about 50 to about 300 angstroms.

FIG. 6 shows a schematic cross-sectional diagram of a field effect transistor formed in accordance with a first embodiment of the invention. The field effect transistor is a metal gate field effect transistor that uses laser annealing for annealing a pair of source/drain regions 28 to activate device dopants. To achieve the foregoing result, the invention provides for selecting a metal gate 18' that has a reflectivity so that electrical properties of the metal gate 18' (and also the interface between the metal gate 18' and the gate dielectric 16') are not compromised when laser annealing the source/drain regions 28 adjoining the metal gate 18' to form the annealed source/drain regions 28'.

Figure 7:
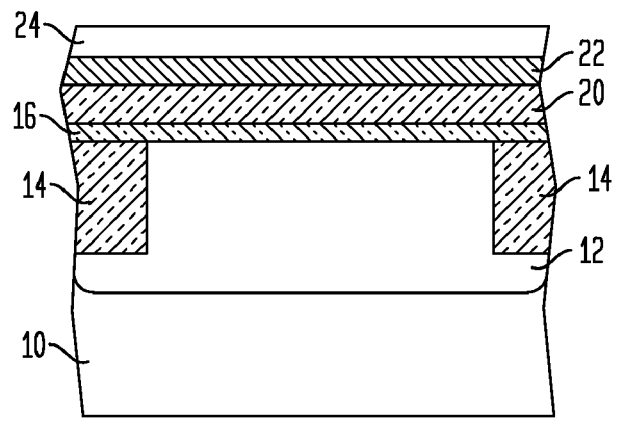
FIG. 7 and FIG. 8 show a pair of schematic cross-sectional diagrams illustrating the results of initial stages in fabricating a fully silicided gate field effect transistor in accordance with additional embodiments of the invention.
Figure 8:
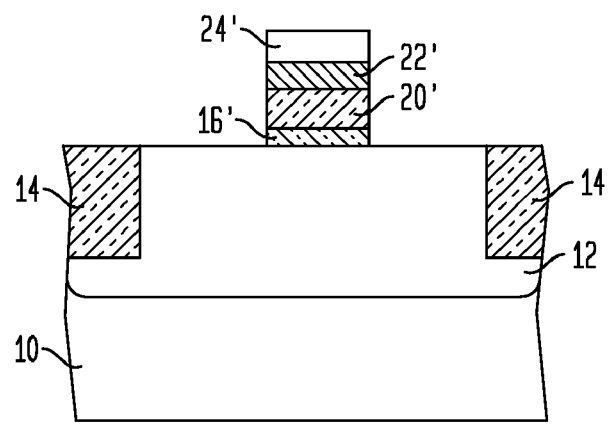

FIG. 7 and FIG. 8 show a pair of schematic cross-sectional diagrams illustrating the results of initial stages in fabricating a fully silicide gate field effect transistor in accordance with additional embodiments of the invention.

FIG. 7 shows a schematic cross-sectional diagram of a semiconductor structure analogous to the semiconductor structure whose schematic cross-sectional diagram is illustrated in FIG. 1, but with the substitution of a silicon layer 20 and a silicide forming metal layer 22 for the metal gate material layer 18. Although FIG. 7 illustrates the silicide forming metal layer 22 located upon the silicon layer 20, an inverted ordering of the silicon layer 20 and the silicide forming metal layer 22, or sandwiched layers of 20/22/20, are also in accordance with the invention.

The silicon layer 20 may comprise any of several silicon materials. Typically included are amorphous silicon materials and polycrystalline silicon materials. Other silicon materials, such as silicon-germanium alloy materials, are not excluded. The silicon layer 20 may be formed using any of several methods. Non-limiting examples include chemical vapor deposition methods and physical vapor deposition methods. Typically, the silicon layer 20 comprises a polycrystalline silicon material having a thickness from about 500 to about 1500 angstroms.

The silicide forming metal layer 22 may comprise any of several silicide forming metals, including, but not limited to cobalt, nickel, platinum, tungsten, titanium and their alloys. The silicide forming metal layer 22 may be formed using a chemical vapor deposition method or a physical vapor deposition method. Typically, the silicide forming metal layer 22 has a thickness so that both the silicide forming metal layer 22 and the silicon layer 20 are completely consumed (or nearly so) incident to further thermal annealing of the silicide forming metal layer 22 and the silicon layer 20 to form a fully silicide gate. Typically, that thickness will be from about 300 to about 1500 angstroms.

FIG. 8 corresponds with FIG. 2, but with the exception of a silicon layer 20' and a silicide forming metal layer 22' interposed between the gate dielectric 16' and the capping layer 24'. The silicon layer 20' may be patterned from the silicon layer 20, and the silicide forming metal layer 22' may be patterned from the silicide forming metal layer 22, while using methods that are conventional in the art. Typically included are plasma etch methods, although other etch methods are not excluded. In concert with disclosure above, use of plasma etch methods is desirable insofar as plasma etch methods generally provide straight sidewalls, while wet chemical etch methods, for example, typically do not.

Figure 9:
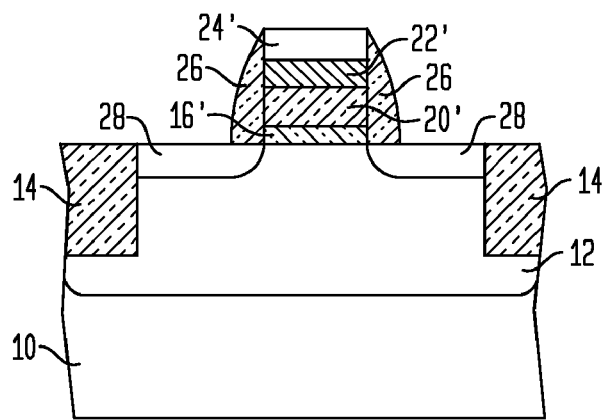
FIG. 9 and FIG. 10 show a pair of schematic cross-sectional diagrams illustrating the results of final stages in fabricating a fully silicided gate field effect transistor in accordance with a first additional embodiment of the invention.

FIG. 9 shows a first additional embodiment illustrating the results of additional processing for the semiconductor structure whose schematic cross-sectional diagram is illustrated in FIG. 8.

FIG. 9 first shows a spacer 26 located adjoining a pair of opposite sides of a gate electrode stack comprising the gate dielectric 16', the silicon layer 20', the silicide forming metal layer 22' and the capping layer 24'. The spacer 26 may comprise materials, have dimensions and be formed using methods that are generally conventional in the semiconductor fabrication art. The spacer 26 may be formed similarly to the spacer 26 that is illustrated in FIG. 3.

FIG. 9 also shows a pair of source/drain regions 28. They may similarly be formed using methods and materials that are used for forming the pair of source/drain regions 28 that is illustrated in FIG. 4.

Figure 10:
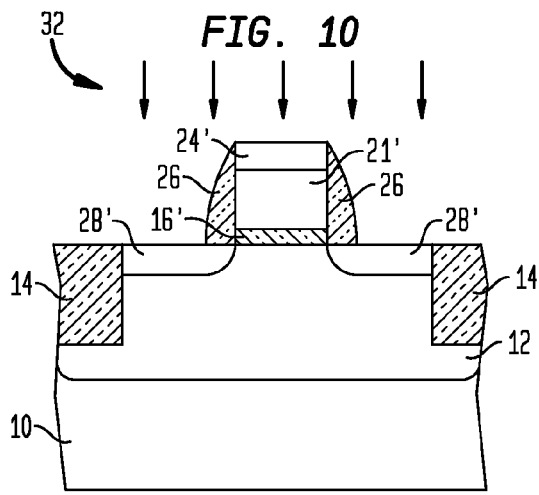

FIG. 10 shows the results of further processing of the semiconductor structure whose schematic cross-sectional diagram is illustrated in FIG. 9.

FIG. 10 shows the results of simultaneously opto-thermal annealing: (1) the silicon layer 20' and the silicide forming metal layer 22' to form a silicide layer 21' that serves as a fully silicide gate; and (2) the source/drain regions 28 to form annealed source/drain regions 28'. The foregoing opto-thermal annealing uses an opto-thermal annealing treatment 32 that is analogous, equivalent or identical to the opto-thermal annealing treatment 32 that is illustrated in FIG. 5.

FIG. 10 shows a schematic cross-sectional diagram of a semiconductor structure in accordance with a first additional embodiment of the invention. The first additional embodiment provides a fully silicide gate field effect transistor with dopant activated source/drain region 28' junctions that result from opto-thermal annealing rather than an alternative thermal annealing.

Figure 11:
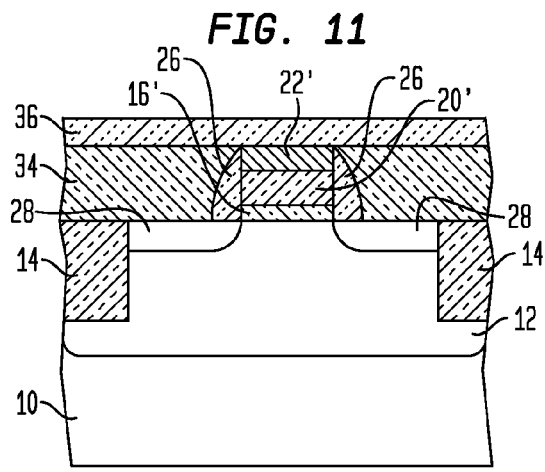
FIG. 11 and FIG. 12 show a pair of schematic cross-sectional diagrams illustrating the results of final stages in fabricating a fully silicided gate field effect transistor in accordance with a second additional embodiment of the invention.

FIG. 11 shows a schematic cross-sectional diagram illustrating the results of a second further processing of the semiconductor structure whose schematic cross-sectional diagram is illustrated in FIG. 8.

FIG. 11 first shows the results of stripping the capping layer 24' from the semiconductor structure whose schematic cross-sectional diagram is illustrated in FIG. 8. The capping layer 24' is optionally, but preferably, stripped for reasons that will become clearer within the context of additional disclosure below. It is particularly desirable to strip the capping layer 24' when the capping layer 24' comprises a thermal insulator material. FIG. 11 also shows spacer 26 (i.e., of lesser intended height than spacer 26 illustrated in FIG. 9) and a pair of source/drain regions 28 that are also illustrated in FIG. 9. The spacer 28 and the source/drain regions 28 may be formed using methods and materials that are otherwise generally conventional in the art. In accordance with disclosure above, the spacer 26 may comprise any of several dielectric materials. The spacer 26 is typically formed using a blanket layer deposition and anisotropic etchback process.

FIG. 11 also illustrates a thermal insulator layer 34 located upon and covering the source/drain regions 28, but not located upon or covering the silicide forming metal layer 22'. In addition, an optional thermal absorber layer 36 is located upon the silicide forming metal layer 22' and the thermal insulator layer 34.

The thermal insulator layer 34 typically comprises a dielectric material that is a thermal insulator material. Oxides, nitrides and oxynitrides of silicon are common. Oxides, nitrides and oxynitrides of other elements are not excluded. Also desirable are porous dielectric materials, such as aerogels and hydrogels, that are particularly effective as thermal insulator materials. Typically, the thermal insulator layer 34 comprises a silicon oxide material having a thickness planarized to the level of the silicide forming metal layer 22'.

The thermal absorber layer 36 comprises a thermal absorber material. Any of several thermal absorber materials may be used. Included are generally amorphous materials that have inhibited reflectivity that provide enhanced absorption of opto-thermal radiation (i.e., greater than about 80 percent). Also included in particular are amorphous carbon materials. Typically, the thermal absorber layer comprises an amorphous carbon material having a thickness from about 100 to about 500 angstroms.

Figure 12:
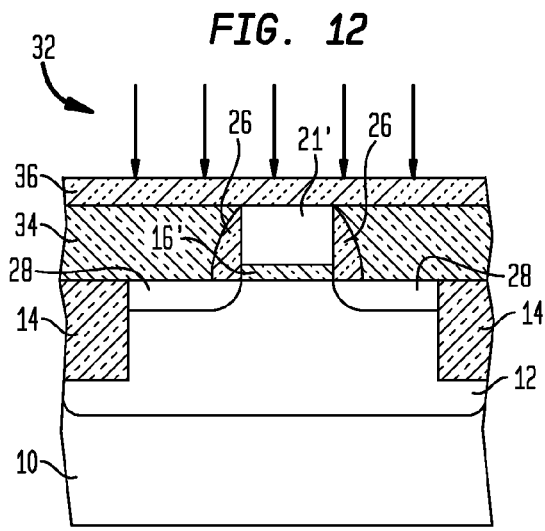

FIG. 12 shows the results of opto-thermally annealing the semiconductor structure of FIG. 11 while using the opto-thermal annealing treatment 32 that is also illustrated in FIG. 10. When using the opto-thermal annealing treatment 32 that is illustrated in FIG. 12, the silicide forming metal layer 20' and the silicon layer 22' are laser annealed to form the silicide layer 21' that serves as a fully silicided gate. During the opto-thermal annealing, the source/drain regions 28 experience an attenuated or eliminated thermal exposure.

FIG. 12 shows a schematic cross-sectional diagram of a field effect transistor structure that results from a second additional embodiment of the invention. The field effect transistor structure has a silicide layer 21' that serves as a fully silicided gate. The silicide layer 21' is formed using an opto-thermal annealing treatment 32 with a reduced or eliminated thermal exposure in source/drain regions 28.

The preferred embodiments of the invention are illustrative of the invention rather than limiting of the invention. Revisions and modifications may be made to methods, materials, structures and dimensions in accordance with the preferred embodiments of the invention, while still providing an embodiment in accordance with the invention, further in accordance with the accompanying claims.

What is claimed is:

1. A method for forming a metal gate field effect transistor comprising:
    forming a titanium metal gate upon a gate dielectric formed over a semiconductor substrate, and a source region and a drain region are present in the semiconductor substrate on opposing sides of the titanium metal gate; and
    opto-thermal annealing the source region and the drain region with a laser anneal to activate the source region and the drain region while avoiding opto-thermal annealing damage to the metal gate and metal gate to gate dielectric interface, wherein opto-thermal annealing damage to the metal gate and metal gate to gate dielectric interface is avoided by an opto-thermal annealing radiation reflectivity in the titanium metal gate that is at least 50 percent provided by a laser wavelength ranging from 200nm to 1200 nm, wherein the opto-thermal annealing uses a temperature ranging from 1000° to 1400° centigrade, and wherein the opto-thermal annealing uses a time period ranging from 0.01 to 100 milliseconds.

2. The method of claim 1 wherein the forming the metal gate comprises forming the metal gate while using a capping layer as a hard mask, and subsequently stripping the capping layer prior to opto-thermal annealing the source region and the drain region.

3. The method of claim 1, wherein an upper surface and sidewalls of the titanium metal gate are exposed.

4. The method of claim 1, wherein the laser wavelength is 880 nm.

5. A method for forming a metal gate field effect transistor comprising:

forming a titanium metal gate upon a gate dielectric formed over a semiconductor substrate, wherein an upper surface and sidewalls of the titanium metal gate are exposed, and a source region and a drain region are present in the semiconductor substrate on opposing sides of the titanium metal gate; and opto-thermal annealing the source region and the drain region with a laser anneal to activate the source region and the drain region while avoiding opto-thermal annealing damage to the metal gate and metal gate to gate dielectric interface, wherein opto-thermal annealing damage to the metal gate and metal gate to gate dielectric interface is avoided by an opto-thermal annealing radiation reflectivity in the titanium metal gate that is at least 50 percent, wherein the opto-thermal annealing uses a time period ranging from 0.01 to 100 milliseconds at a temperature ranging from 1000° C. to 1400° C.

6. The method of claim 5 wherein the forming the metal gate comprises forming the metal gate while using a capping layer as a hard mask, and subsequently stripping the capping layer prior to opto-thermal annealing the source/drain region.

7. The method of claim 5 wherein the laser annealing includes a laser wavelength ranging from 200 nm to 1200 nm.

8. The method of claim 7 wherein the laser wavelength is 880 nm.

* * * * *